(12) United States Patent
Wynia et al.

(10) Patent No.: US 12,309,964 B2
(45) Date of Patent: May 20, 2025

(54) SWAPPABLE AIRFLOW CASSETTE FOR POWER SUPPLY UNITS

(71) Applicant: Dell Products L.P., Round Rock, TX (US)

(72) Inventors: James P. Wynia, San Jose, CA (US); Joanne Cuijuan Zhang, San Jose, CA (US); James L. Mangin, Tracy, CA (US)

(73) Assignee: Dell Products L.P., Round Rock, TX (US)

( * ) Notice: Subject to any disclaimer, the term of this patent is extended or adjusted under 35 U.S.C. 154(b) by 225 days.

(21) Appl. No.: 17/984,415

(22) Filed: Nov. 10, 2022

(65) Prior Publication Data

US 2024/0164049 A1 May 16, 2024

(51) Int. Cl.
*H05K 7/20* (2006.01)

(52) U.S. Cl.
CPC ..... *H05K 7/20172* (2013.01); *H05K 7/20145* (2013.01); *H05K 7/20209* (2013.01)

(58) Field of Classification Search
CPC ........... H05K 7/20145; H05K 7/20172; H05K 7/20209
See application file for complete search history.

(56) References Cited

U.S. PATENT DOCUMENTS

| | | | | |
|---|---|---|---|---|
| 7,492,591 B1 * | 2/2009 | Aybay | ................ | H05K 7/20581 |
| | | | | 415/206 |
| 7,675,747 B1 * | 3/2010 | Ong | ................... | H05K 7/20727 |
| | | | | 361/679.48 |
| 7,697,287 B2 * | 4/2010 | Yin | ..................... | F04D 25/0613 |
| | | | | 361/679.48 |
| 7,729,116 B1 * | 6/2010 | Aybay | ................ | H05K 7/20736 |
| | | | | 361/679.48 |
| 7,839,638 B2 * | 11/2010 | Ye | ............. | G06F 1/20 |
| | | | | 415/214.1 |
| 7,983,039 B1 * | 7/2011 | Nguyen | ............ | H05K 7/20727 |
| | | | | 361/695 |
| 8,068,340 B1 * | 11/2011 | Nguyen | ............ | H05K 7/20172 |
| | | | | 174/547 |
| 8,385,064 B1 * | 2/2013 | Smith | ................ | H05K 7/20727 |
| | | | | 361/679.48 |
| 9,055,693 B2 * | 6/2015 | Arreola | ............. | H05K 7/20172 |
| 9,173,326 B1 * | 10/2015 | Smith | ................ | H05K 7/20727 |
| 9,433,124 B2 * | 8/2016 | Wilcox | ................ | F04D 29/563 |

(Continued)

FOREIGN PATENT DOCUMENTS

| | | | | |
|---|---|---|---|---|
| CN | 2480989 Y | * | 3/2002 | |
| CN | 220687645 U | * | 3/2024 | |
| WO | WO-2024109052 A1 | * | 5/2024 | ............... H05K 7/14 |

*Primary Examiner* — Robert J Hoffberg
(74) *Attorney, Agent, or Firm* — Larson Newman, LLP (57) ABSTRACT

A swappable cooling fan component for an information handling system includes a cooling fan, an attachment panel, and a connector panel. The attachment panel is in physical communication with a first surface of the cooling fan. The connector panel is in physical communication with a second surface of the cooling fan. The connector panel includes first and second connectors. The first connector receives control signals for the cooling fan when the swappable cooling fan component is in a first orientation. The second connector receives the control signals for the cooling fan when the swappable cooling fan component is in a second orientation.

16 Claims, 5 Drawing Sheets

(56) References Cited

U.S. PATENT DOCUMENTS

| | | | |
|---|---|---|---|
| 9,458,854 B2* | 10/2016 | Cananzi | F04D 25/0693 |
| 9,920,772 B2* | 3/2018 | Wilcox | H05K 7/2019 |
| 11,572,896 B2* | 2/2023 | Lu | F04D 29/601 |
| 11,839,051 B2* | 12/2023 | Rathinasamy | H05K 7/20172 |
| 2015/0177750 A1 | 6/2015 | Bailey et al. | |
| 2021/0333847 A1 | 10/2021 | Yang et al. | |
| 2024/0102491 A1* | 3/2024 | Chen | F04D 25/0693 |

* cited by examiner

SWAPPABLE AIRFLOW CASSETTE FOR POWER SUPPLY UNITS

FIELD OF THE DISCLOSURE

This disclosure generally relates to information handling systems, and more particularly relates to a swappable airflow cassette for power supply units.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

A swappable cooling fan component for an information handling system includes a cooling fan, an attachment panel, and a connector panel. The attachment panel is in physical communication with a first surface of the cooling fan. The connector panel is in physical communication with a second surface of the cooling fan. The connector panel includes first and second connectors. The first connector may receive control signals for the cooling fan when the swappable cooling fan component is in a first orientation. The second connector may receive the control signals for the cooling fan when the swappable cooling fan component is in a second orientation.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings.

Figure 1:
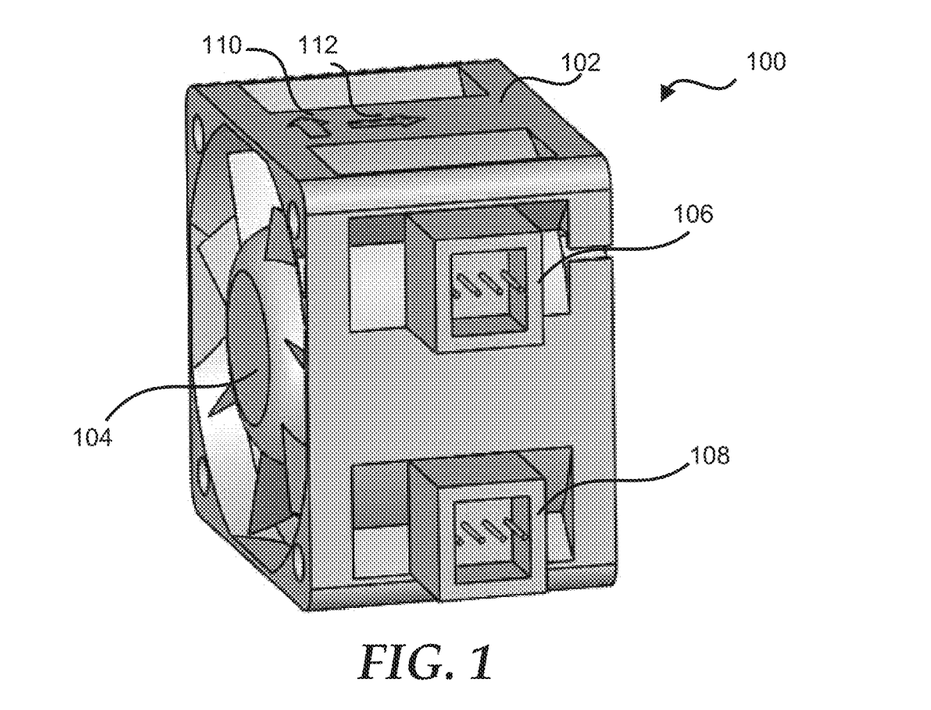
FIG. 1 is a perspective view of a cooling fan module for an information handling system according to an embodiment of the present disclosure.

FIG. 1 shows a cooling fan module 100 of an information handling system according to at least one embodiment of the present disclosure. For purposes of this disclosure, an information handling system can include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (such as a desktop or laptop), tablet computer, mobile device (such as a personal digital assistant (PDA) or smart phone), blade server or rack server, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Cooling fan module 100 includes a cooling fan 102, fan blades 104, connectors 106 and 108, and directional arrows 110 and 112. In an example, fan blades 104 may rotate in the direction indicated by arrow 110 based on whether cooling fan 102 is connected to a control module via connectors 106 or 108. Fan blades 104 may also push air through cooling fan 102 and cooling fan module 100 in the direction of arrow 112 based on whether cooling fan 102 is connected to a control module via connectors 106 or 108. In certain examples, a rotation direction of fan blades 104 and the direction of flow air through cooling fan 102 may be based on the connector utilized in cooling fan module 100, such as connector 106 or 108 as will be described herein. In certain examples, connector 106 is located near a top surface of cooling fan 100, and connector 108 is located near a bottom surface of the cooling fan.

Figure 2:
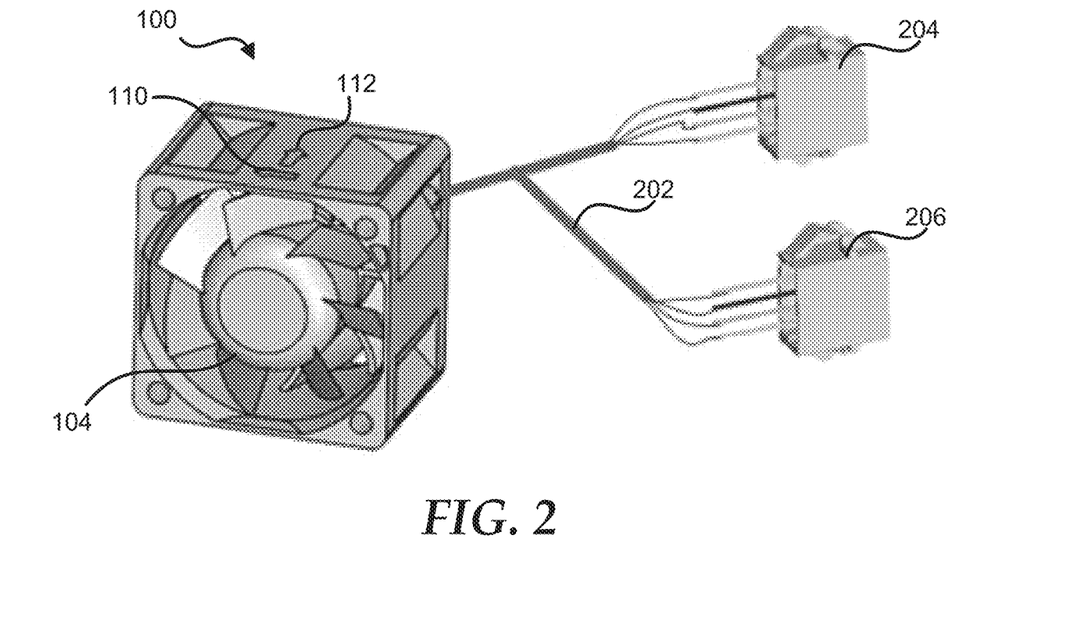
FIG. 2 is a perspective view of another embodiment cooling fan module for an information handling system.

FIG. 2 illustrates another embodiment cooling fan module 100 for an information handling system according to an embodiment of the present disclosure. In this embodiment, cooling fan module 100 includes a connecting wire 202, connectors 204 and 206, fan blades 104, and arrows 110 and 112. In an example, connecting wire 202 and connectors 204 and 206 may replace connectors 106 and 108 in FIG. 1. For example, connectors 204 and 206 may provide signals to control a rotational direction of fan blades 104 via connecting wire 202.

Figure 3:
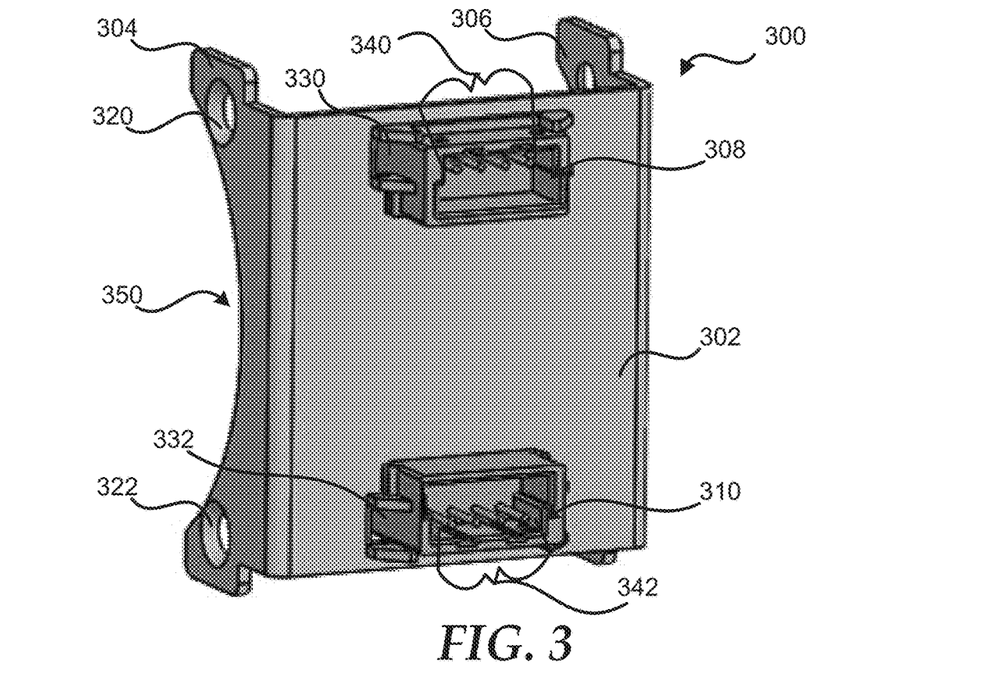
FIG. 3 is a perspective view of connector panel for a cooling fan module according to an embodiment of the present disclosure.

FIG. 3 illustrates a connector panel 300 for a cooling fan module, such as cooling fan module 100 of FIG. 1, according to an embodiment of the present disclosure. Connector panel 300 include a main portion 302, side portions 304 and 306, and connectors 308 and 310. Side panel 304 includes mounting holes 320 and 322. Side panel 306 includes mounting holes 320 and 322 as shown in FIG. 3. Connector 308 includes stop portions 330, which may be placed in physical communication with main portion 302 as connector 308 is inserted through the main portion. Similarly, connector 310 includes stop portions 332, which may be placed in physical communication with main portion 302 as connector 310 is inserted through the main portion. In certain examples, connector 308 is located near a top edge of the main portion 302, and connector 310 is located near a bottom edge of the main portion.

In an example, connector 308 may be inserted through and snap fit onto main portion 302 to hold the connector securely within the main portion. In certain examples, connector 310 may be inserted through and snap fit onto main portion 302 to hold the connector securely within the main portion. In certain examples, connector 308 includes multiple wires 340, which in turn may communicate with connector 106 of FIG. 1. Similarly, connector 310 includes multiple wires 342, which in turn may communicate with connector 108 of FIG. 1.

As shown in FIG. 3, side portion 304 may extend from a first edge of main portion 302, such that side portion 304 may extend perpendicularly from the first edge of main portion 302. In an example, side portion 304 may include a concave region 350, such that the side portion may line an edge of fan blades 104 in FIG. 1 when connector panel 300 is securely mounted to cooling fan module 100 of FIG. 1. In certain examples, side portion 306 may extend from a second edge of the main portion, such side portion 306 may extend perpendicularly from the second of the main portion. Side portion 306 may include a concave region that is substantially similarly to concave portion 350, such that the side portion may line an edge of fan blades 104 in FIG. 1 when connector panel 300 is securely mounted to cooling fan module 100 of FIG. 1. In an example, the first and second edges may be distal edges of main portion 302. In certain examples, connector panel 300 may be securely mounted to cooling fan module 100 of FIG. 1 in any suitable manner, such as via mounting holes 320, 322, 320, and 322 as will be described with respect to FIG. 5 below.

Figure 4:
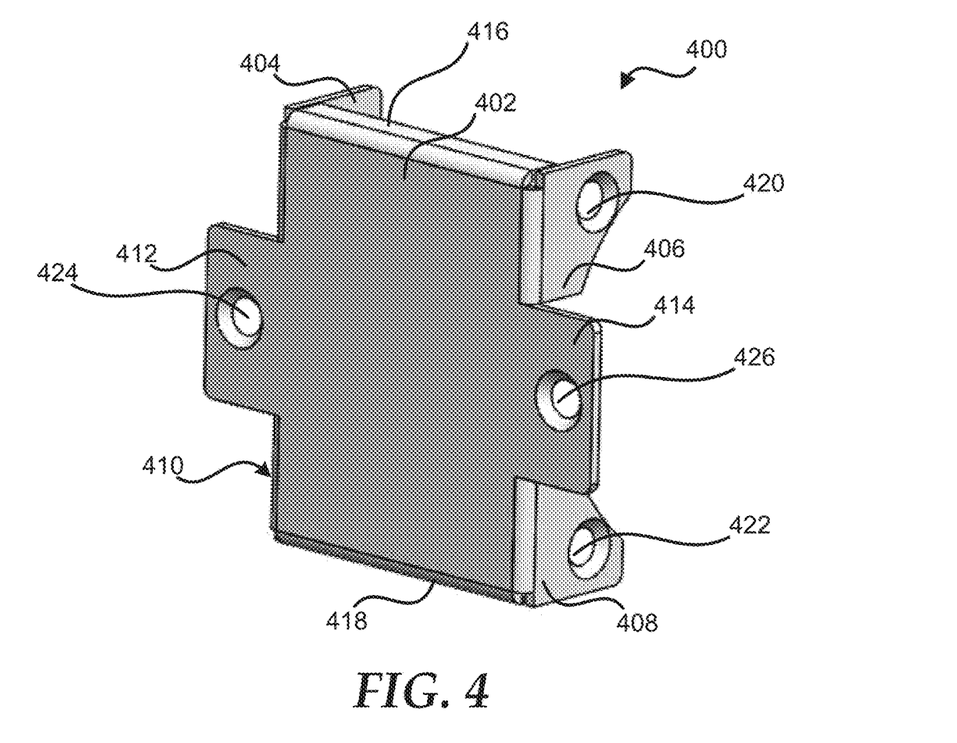
FIG. 4 is perspective view of an attachment panel for a cooling fan module according to an embodiment of the present disclosure.

FIG. 4 illustrates an attachment panel 400 for a cooling fan module, such as cooling fan module 100 of FIG. 1, according to an embodiment of the present disclosure. Attachment panel 400 includes a main portion 402, side portions 404, 406, 408, and 410, connection portion 412 and 414, and cover portions 416 and 418. In certain examples, each of side portions 404, 406, 408, and 410 include a corresponding mounting hole. For example, side portion 406 includes a mounting hole 420 and side portion 408 includes a mounting hole 422.

In an example, side portions 404 and 410 may extend from a first edge of main portion 402, and side portions 406 and 408 may extend from a second edge of the main portion. In certain examples, side portions 404 and 410 may extend perpendicularly from the first edge of main portion 402, and side portions 406 and 408 may extend perpendicularly from the second of the main portion. In an example, connection portion 412 may extend from the first edge of main portion 402, and connection portion 414 may extend from the second edge of the main portion. Connection portion 412 includes a mounting hole 424 and connection portion 414 includes a mounting hole 426. In certain examples, connection portion 412 may extend parallel from the first edge of main portion 402, and connection portion 414 may extend parallel from the second of the main portion.

Cover portion 416 may extend from a third edge of main portion 402, and cover portion 418 may extend from a fourth edge of the main portion. In an example, the first and second edges may be distal edges of main portion 402. The third edge may extend between first ends of the first and second edges, and the fourth edge may extend between second ends of the first and second edges. In an example, cover portion 416 may extend parallel from the third edge of main portion 402 for a particular length and then turn and extend perpendicular from the main portion in a substantially similar direction as side portions 404, 406, 408 and 410. Similarly, cover portion 418 may extend parallel from the fourth edge of main portion 402 for a particular length and then turn and extend perpendicular from the main portion in a substantially similar direction as side portions 404, 406, 408 and 410.

Figure 5:
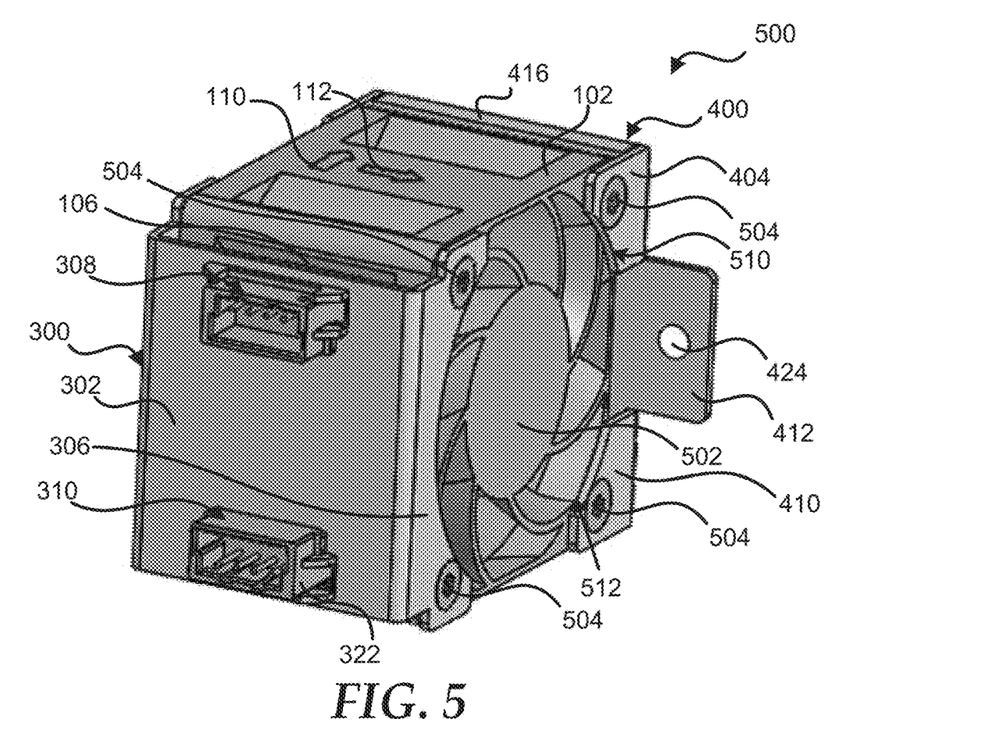
FIG. 5 is a perspective view of a swappable cooling fan component according to an embodiment of the present disclosure.

FIG. 5 illustrates a swappable cooling fan component 500 according to an embodiment of the present disclosure. Swappable cooling fan component 500 includes cooling fan 102, connector panel 300, and attachment panel 400. As shown in FIG. 5, cooling fan 102 includes a directional airflow component 502 to enable airflow through the cooling fan. In certain examples, connector panel 300 and attachment panel 400 may each be securely attached to cooling fan 102 by any suitable manner including, but not limited to, the connector panel and the attachment panel being spot welded to the cooling fan, and by mounting screw. In an example, mounting screw 504 may be inserted through the mounting holes of connector panel 300 and attachment panel 400 as shown in FIG. 5.

When connector panel 300 is in physical communication with cooling fan 102, connector 308 may be placed in physical and electrical communication with connector 106 of the cooling fan. Similarly, when connector panel 300 is in physical communication with cooling fan 102, connector 310 may be placed in physical and electrical communication with connector 108 of the cooling fan. In an example, wires 340 of connector 308 may provide electrical control signals to cooling fan 102 via connector 106. Similarly, wires 342 of connector 310 may provide electrical control signals to cooling fan 102 via connector 108.

When attachment panel 400 is in physical communication with cooling fan 102, cover portions 416 and 418 may overlap the cooling fan. For example, cover portion 416 overlaps a surface of cooling fan 102 as illustrated in FIG. 5. In an example, side portions 404, 406, 408, and 410 of attachment portion 400 may each include a curved region, such as curved region 510 of side portion 404 and curved region 512 of side portion 410. In certain examples, when connector panel 300 is securely mounted to cooling fan 102, the curved regions of side portions 404, 406, 408, and 410 may line an edge of fan blades 104 in FIG. 1 and directional airflow component 502.

Figure 6:
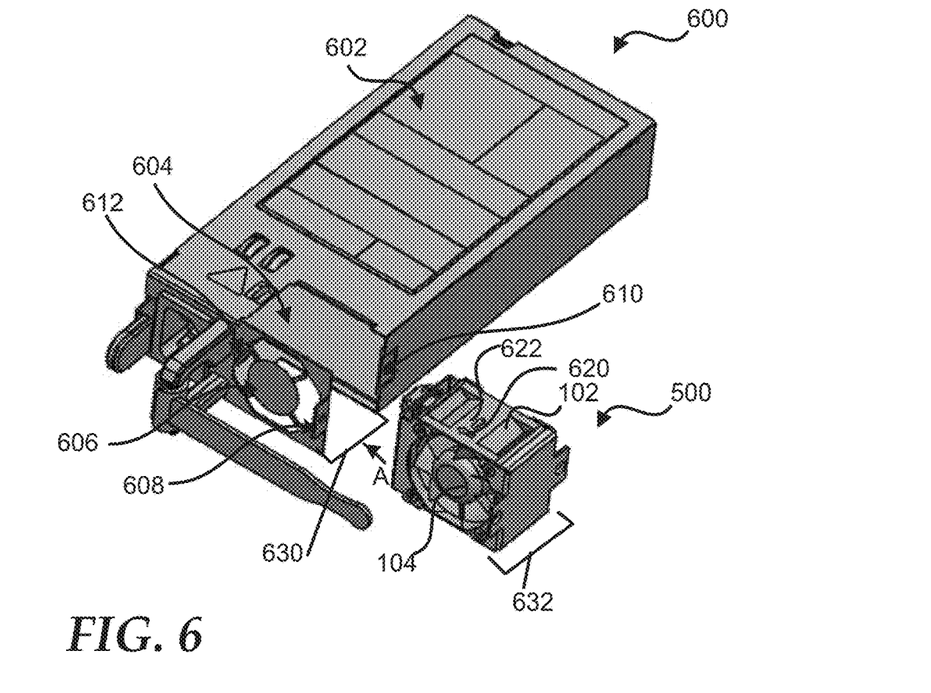
FIGS. 6 and 7 are perspective views of a swappable cooling fan component in a first orientation being attached to a power supply unit according to an embodiment of the present disclosure.
Figure 7:
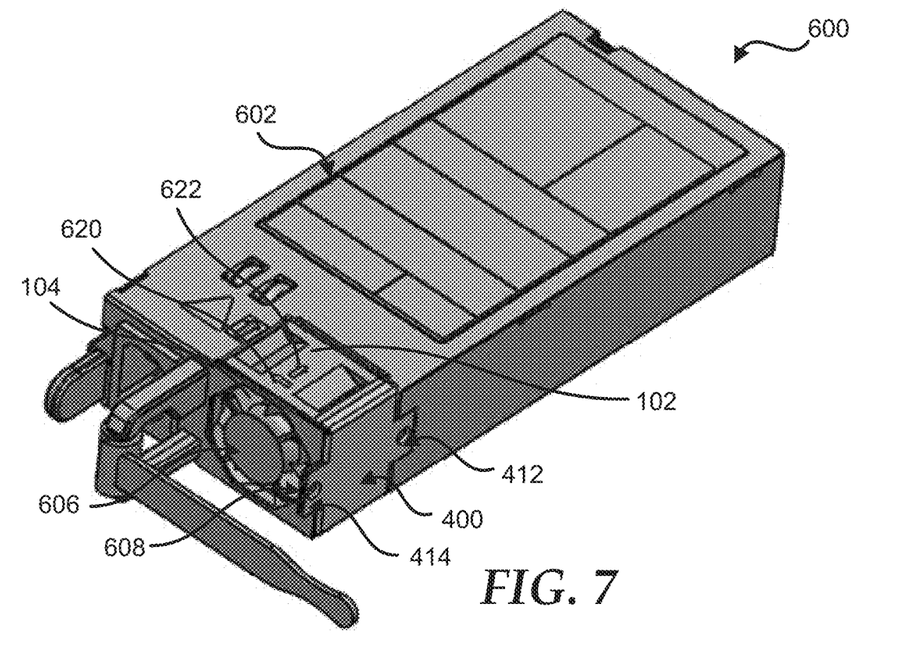

FIGS. 6 and 7 show a power supply unit 600 and swappable cooling fan component 500 according to an embodiment of the present disclosure. Power supply unit 600 includes an enclosure 602, a board mount 604, a cooling fan cover 606, attachment components 608 and 610, and a board mount connector 612. In an example, swappable cooling fan component 500 may be in a first orientation to provide an airflow in a first direction, such that cooling fan 102 may push the airflow into power supply unit 602. In certain examples, arrows 620 and 622 may illustrate that swappable cooling fan component 500 is in the first orientation. For example, arrow 620 may illustrate that fan blades 104 rotate in a counterclockwise direction, and arrow 622 may illustrate that the airflow direction is from outside power supply unit 600 to inside enclosure 602.

In an example, swappable cooling fan component 500 may be inserted into a gap 630 between enclosure 602 and cooling fan cover 606. For example, swappable cooling fan component 500 may be moved in the direction of arrow A, and the swappable cooling fan component may be inserted in between enclosure 602 and cooling fan cover 606. In certain examples, a width 632 may be such that a tolerance between gap 630 and width 632 may small enough to provide a proper alignment between connector 308 of swappable cooling fan component 500 and connector 612 on board mount 604. In an example, swappable cooling fan component 500 may include a guide pin to further ensure proper alignment between connectors 308 and 612. In an example, any suitable number of pins in connector 308 may provide a signal or other indication to mount board 604 that swappable cooling fan component 500 is in the first orientation. For example, connector 308 may include a grounding pin, a personality pin, or the like to indicate that the first orientation of swappable cooling fan component 500.

Referring now to FIG. 7, cooling fan 102 of swappable cooling fan component 500 is fully inserted between enclosure 602 and cooling fan cover 606, such that connection portion 412 is in physical communication with attachment component 610 and connection portion 414 is in physical communication with attachment component 608. In an example, connection portions 412 and 414 may be secured to respective attachment component 610 and 608 via any suitable removable component, such as via a mounting screw. When swappable cooling fan component 500 is within power supply unit 600, cooling fan cover 606 may be positioned in an alignment with fan blades 104.

Figure 8:
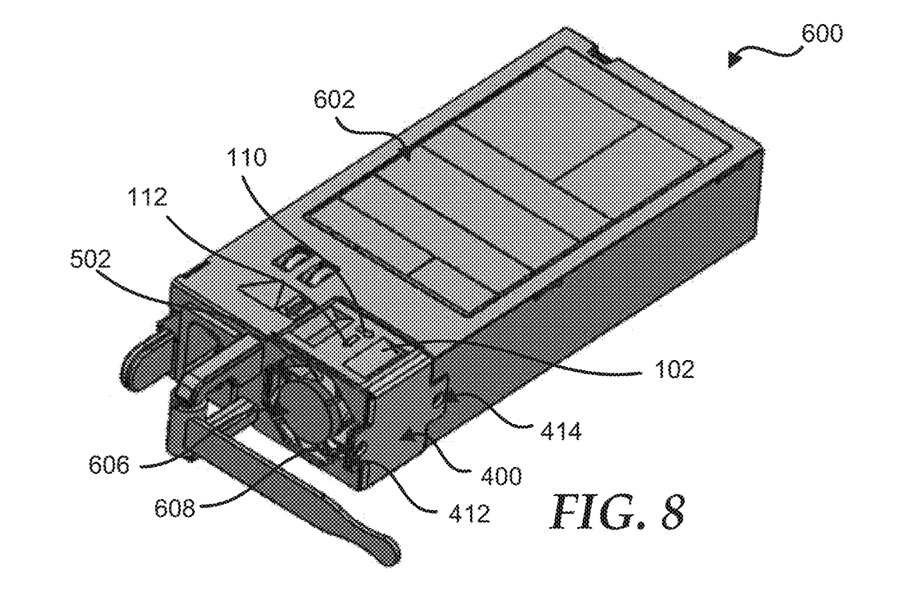
FIG. 8 is a perspective view of a swappable cooling fan component in a second orientation being attached to a power supply unit according to an embodiment of the present disclosure.

FIG. 8 illustrates power supply unit 600 and swappable cooling fan component 500 according to an embodiment of the present disclosure. In an example, swappable cooling fan component 500 may be in a second orientation to provide an airflow in a second direction, such that cooling fan 102 may pull an airflow out of power supply unit 602. Swappable cooling fan component 500 may be switched between the first and second orientations by being rotated 180 Degrees such that the location of fan blades 104 and the location of directional airflow component 502 are switched. In certain examples, arrows 110 and 112 may illustrate that swappable cooling fan component 500 is in the second orientation. For example, arrow 110 may illustrate that fan blades 104 rotate in a clockwise direction, and arrow 112 may illustrate that the airflow direction is from inside power supply unit 600 to outside enclosure 602.

In an example, swappable cooling fan component 500 may be inserted in between enclosure 602 and cooling fan cover 606. In certain examples, the width of swappable cooling fan component 500 may be such that the tolerance may be small enough to provide a proper alignment between connector 310 of the swappable cooling fan component and connector 612 on board mount 604. In an example, swappable cooling fan component 500 may include a guide pin to further ensure proper alignment between connectors 310 and 612. When in the second orientation, connector 310 of connector panel 300 is attached to connector 612 of power supply unit 600.

In an example, any suitable number of pins in connector 310 may provide a signal or other indication to mount board 604 that swappable cooling fan component 500 is in the first orientation. For example, connector 310 may include a grounding pin, a personality pin, or the like to indicate that the first orientation of swappable cooling fan component 500. In an example, the indication signal may be received and analyzed by firmware of power supply unit 600 to determine the orientation of swappable cooling fan component 500. In response to the determination of the orientation of swappable cooling fan component 500, the firmware of power supply unit 600 may utilize different temperature sensors within enclosure 602 to control the speed of fan blades 104.

In certain examples, when swappable cooling fan component 500 is in the second orientation and inserted between enclosure 602 and cooling fan cover 606, connection portion 412 may be in physical communication with attachment component 608 and connection portion 414 may be in physical communication with attachment component 610. In an example, connection portions 412 and 414 may be secured to respective attachment component 608 and 610 via any suitable removable component, such as via a mounting screw. When swappable cooling fan component 500 is within power supply unit 600, cooling fan cover 606 may be positioned in an alignment with directional airflow component 502.

Figure 9:
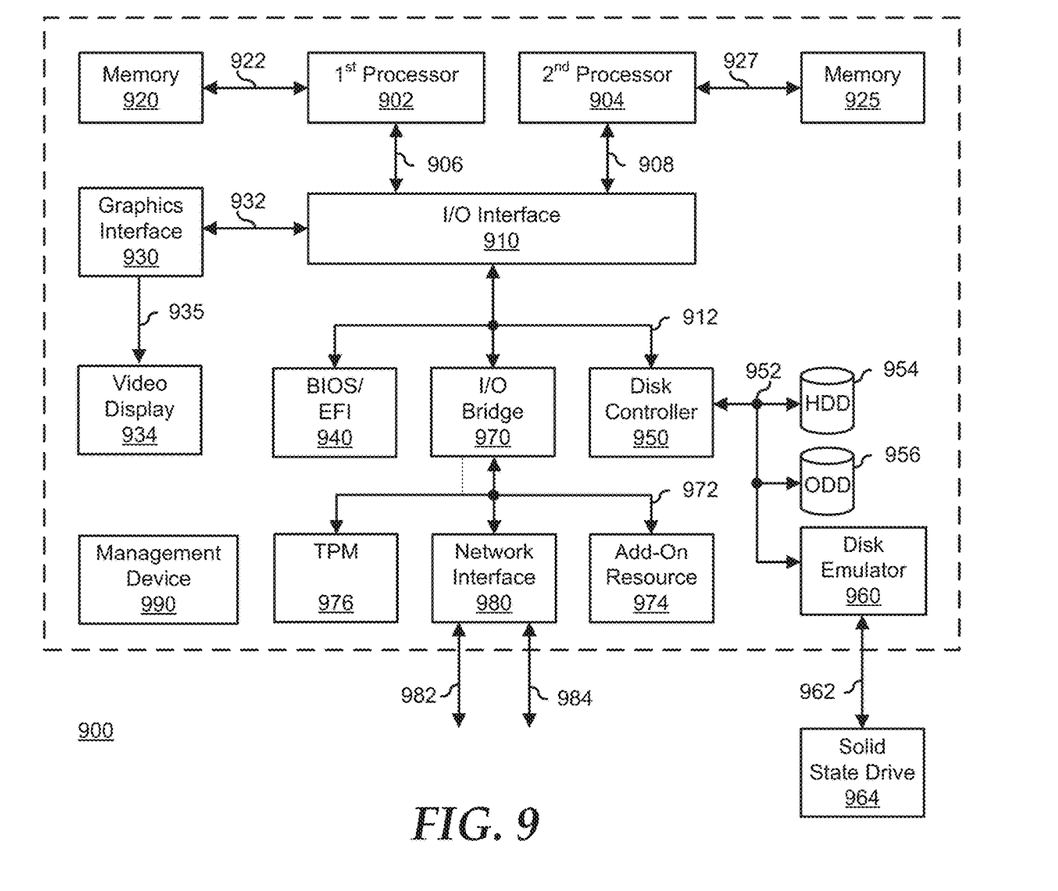
FIG. 9 is a block diagram of a general information handling system according to an embodiment of the present disclosure.

FIG. 9 shows a generalized embodiment of an information handling system 900 according to an embodiment of the present disclosure. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 900 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 900 can include processing resources for executing machine-executable code, such as a central processing unit (CPU), a programmable logic array (PLA), an embedded device such as a System-on-a-Chip (SoC), or other control logic hardware. Information handling system 900 can also include one or more computer-readable medium for storing machine-executable code, such as software or data. Additional components of information handling system 900 can include one or more storage devices that can store machine-executable code, one or more communications ports for communicating with external devices, and various input and output (I/O) devices, such as a keyboard, a mouse, and a video display.

Information handling system 900 can also include one or more buses operable to transmit information between the various hardware components.

Information handling system 900 can include devices or modules that embody one or more of the devices or modules described below and operates to perform one or more of the methods described below. Information handling system 900 includes a processors 902 and 904, an input/output (I/O) interface 910, memories 920 and 925, a graphics interface 930, a basic input and output system/universal extensible firmware interface (BIOS/UEFI) module 940, a disk controller 950, a hard disk drive (HDD) 954, an optical disk drive (ODD) 956, a disk emulator 960 connected to an external solid state drive (SSD) 962, an I/O bridge 970, one or more add-on resources 974, a trusted platform module (TPM) 976, a network interface 980, a management device 990, and a power supply 995. Processors 902 and 904, I/O interface 910, memory 920, graphics interface 930, BIOS/UEFI module 940, disk controller 950, HDD 954, ODD 956, disk emulator 960, SSD 962, I/O bridge 970, add-on resources 974, TPM 976, and network interface 980 operate together to provide a host environment of information handling system 900 that operates to provide the data processing functionality of the information handling system. The host environment operates to execute machine-executable code, including platform BIOS/UEFI code, device firmware, operating system code, applications, programs, and the like, to perform the data processing tasks associated with information handling system 900.

In the host environment, processor 902 is connected to I/O interface 910 via processor interface 906, and processor 904 is connected to the I/O interface via processor interface 908. Memory 920 is connected to processor 902 via a memory interface 922. Memory 925 is connected to processor 904 via a memory interface 927. Graphics interface 930 is connected to I/O interface 910 via a graphics interface 932 and provides a video display output 936 to a video display 934. In a particular embodiment, information handling system 900 includes separate memories that are dedicated to each of processors 902 and 904 via separate memory interfaces. An example of memories 920 and 930 include random access memory (RAM) such as static RAM (SRAM), dynamic RAM (DRAM), non-volatile RAM (NV-RAM), or the like, read only memory (ROM), another type of memory, or a combination thereof.

BIOS/UEFI module 940, disk controller 950, and I/O bridge 970 are connected to I/O interface 910 via an I/O channel 912. An example of I/O channel 912 includes a Peripheral Component Interconnect (PCI) interface, a PCI-Extended (PCI-X) interface, a high-speed PCI-Express (PCIe) interface, another industry standard or proprietary communication interface, or a combination thereof. I/O interface 910 can also include one or more other I/O interfaces, including an Industry Standard Architecture (ISA) interface, a Small Computer Serial Interface (SCSI) interface, an Inter-Integrated Circuit ($I^2C$) interface, a System Packet Interface (SPI), a Universal Serial Bus (USB), another interface, or a combination thereof. BIOS/UEFI module 940 includes BIOS/UEFI code operable to detect resources within information handling system 900, to provide drivers for the resources, initialize the resources, and access the resources. BIOS/UEFI module 940 includes code that operates to detect resources within information handling system 900, to provide drivers for the resources, to initialize the resources, and to access the resources.

Disk controller 950 includes a disk interface 952 that connects the disk controller to HDD 954, to ODD 956, and to disk emulator 960. An example of disk interface 952 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 960 permits SSD 964 to be connected to information handling system 900 via an external interface 962. An example of external interface 962 includes a USB interface, an IEEE 9394 (Firewire) interface, a proprietary interface, or a combination thereof. Alternatively, solid-state drive 964 can be disposed within information handling system 900.

I/O bridge 970 includes a peripheral interface 972 that connects the I/O bridge to add-on resource 974, to TPM 976, and to network interface 980. Peripheral interface 972 can be the same type of interface as I/O channel 912 or can be a different type of interface. As such, I/O bridge 970 extends the capacity of I/O channel 912 when peripheral interface 972 and the I/O channel are of the same type, and the I/O bridge translates information from a format suitable to the I/O channel to a format suitable to the peripheral channel 972 when they are of a different type. Add-on resource 974 can include a data storage system, an additional graphics interface, a network interface card (NIC), a sound/video processing card, another add-on resource, or a combination thereof. Add-on resource 974 can be on a main circuit board, on separate circuit board or add-in card disposed within information handling system 900, a device that is external to the information handling system, or a combination thereof.

Network interface 980 represents a NIC disposed within information handling system 900, on a main circuit board of the information handling system, integrated onto another component such as I/O interface 910, in another suitable location, or a combination thereof. Network interface device 980 includes network channels 982 and 984 that provide interfaces to devices that are external to information handling system 900. In a particular embodiment, network channels 982 and 984 are of a different type than peripheral channel 972 and network interface 980 translates information from a format suitable to the peripheral channel to a format suitable to external devices. An example of network channels 982 and 984 includes InfiniBand channels, Fibre Channel channels, Gigabit Ethernet channels, proprietary channel architectures, or a combination thereof. Network channels 982 and 984 can be connected to external network resources (not illustrated). The network resource can include another information handling system, a data storage system, another network, a grid management system, another suitable resource, or a combination thereof.

Management device 990 represents one or more processing devices, such as a dedicated baseboard management controller (BMC) System-on-a-Chip (SoC) device, one or more associated memory devices, one or more network interface devices, a complex programmable logic device (CPLD), and the like, which operate together to provide the management environment for information handling system 900. In particular, management device 990 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 900, such as system cooling fans and power supplies. Management device 990 can include a network connection to an external management system, and the management device can communicate with the management system to report status information for information handling system 900, to receive BIOS/UEFI or system firmware updates, or to perform other task for managing and controlling the operation of information handling system 900.

Management device 990 can operate off of a separate power plane from the components of the host environment so that the management device receives power to manage information handling system 900 when the information handling system is otherwise shut down. An example of management device 990 include a commercially available BMC product or other device that operates in accordance with an Intelligent Platform Management Initiative (IPMI) specification, a Web Services Management (WSMan) interface, a Redfish Application Programming Interface (API), another Distributed Management Task Force (DMTF), or other management standard, and can include an Integrated Dell Remote Access Controller (iDRAC), an Embedded Controller (EC), or the like. Management device 990 may further include associated memory devices, logic devices, security devices, or the like, as needed or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system can be a personal computer, a laptop computer, a smart phone, a tablet device or other consumer electronic device, a network server, a network storage device, a switch router or other network communication device, or any other suitable device and may vary in size, shape, performance, functionality, and price. Further, an information handling system can include processing resources for executing machine-executable code, such as a central processing unit (CPU), a programmable logic array (PLA), an embedded device such as a System-on-a-Chip (SoC), or other control logic hardware. An information handling system can also include one or more computer-readable medium for storing machine-executable code, such as software or data. Additional components of information handling system can include one or more storage devices that can store machine-executable code, one or more communications ports for communicating with external devices, and various input and output (I/O) devices, such as a keyboard, a mouse, and a video display. An information handling system can also include one or more buses operable to transmit information between the various hardware components.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A swappable cooling fan component for an information handling system, the swappable cooling fan component comprising:
    a cooling fan including:
        a plurality of fan blades, and
        first and second connectors on a first surface of the cooling fan;
    an attachment panel, wherein a main portion of the attachment panel faces a second surface of the cooling fan; and
    a connector panel, wherein a main portion of the connector panel faces the first surface of the cooling fan, the connector panel includes a concave region to line an edge of the fan blades, the main portion of the connector panel including third and fourth connectors that are in physical and electrical communication with the first and second connectors, respectively, wherein the first connector receives control signals for the cooling fan through the third connector when the swappable cooling fan component is in a first orientation, and the second connector receives the control signals for the cooling fan through the fourth connector when the swappable cooling fan component is in a second orientation.

2. The swappable cooling fan component of claim 1, wherein the attachment portion is configured to mount the swappable cooling fan component to a power supply unit.

3. The swappable cooling fan component of claim 1, wherein when the cooling fan is in the first orientation, the cooling fan provides an airflow in a first direction.

4. The swappable cooling fan component of claim 3, wherein when the cooling fan is in the second orientation, the cooling fan provides the airflow in a second direction.

5. The swappable cooling fan component of claim 4, wherein the cooling fan comprises: the plurality of fan blades, each of the fan blades adjacent to a third surface of the cooling fan, and a directional airflow component adjacent to a fourth surface of the cooling fan.

6. The swappable cooling fan component of claim 5, wherein the airflow moves from the fan blades to the directional airflow component when the swappable cooling fan component is in both the first and second orientations.

7. An information handling system comprising:
    a power supply unit including a first connector to provide control signals; and
    a swappable cooling fan component in physical communication with the power supply unit, the swappable cooling fan component including:
        a cooling fan including:
            a plurality of fan blades, and
            second and third connectors on a first surface of the cooling fan and the second and third connectors alternate in electrical communication with the first connector;

an attachment panel, wherein a main portion of the attachment panel faces a second surface of the cooling fan; and a connector panel, wherein a main portion of the connector panel faces the first surface of the cooling fan, the connector panel includes a concave region to line an edge of the fan blades, the main portion of the connector panel including fourth and fifth connectors that are in physical and electrical communication with the second and third connectors, respectively, wherein the second connector receives the control signals for the cooling fan from the first connector through the fourth connector when the swappable cooling fan component is in a first orientation, and the third connector receives the control signals for the cooling fan from the first connector through the fifth connector when the swappable cooling fan component is in a second orientation.

8. The information handling system of claim 7, wherein the attachment portion is configured to mount the swappable cooling fan component to the power supply unit.

9. The information handling system of claim 7, wherein when the cooling fan is in the first orientation, the cooling fan provides an airflow in a first direction.

10. The information handling system of claim 9, wherein when the cooling fan is in the second orientation, the cooling fan provides the airflow in a second direction.

11. The information handling system of claim 10, wherein the cooling fan comprises: the plurality of fan blades, each of the fan blades near a third surface of the cooling fan, and a directional airflow component near a fourth surface of the cooling fan.

12. The information handling system of claim 11, wherein the airflow moves from the fan blades to the directional airflow component when the swappable cooling fan component is in both the first and second orientations.

13. An information handling system comprising:
a power supply unit including a first connector to provide control signals and a cooling fan cover; and
a swappable cooling fan component in physical communication with the power supply unit, the swappable cooling fan component including:
a cooling fan including:
fan blades, each of the fan blades near a first surface of the cooling fan,
second and third connectors on a second surface of the cooling fan and the second and third connectors alternate in electrical communication with the first connector, and
a directional airflow component near a third surface of the cooling fan, wherein the fan blades are nearest to the cooling fan cover when the swappable cooling fan component is in a first orientation, and the directional airflow component is nearest to the cooling fan cover when the swappable cooling fan component is in a second orientation;
an attachment panel, wherein a main portion of the attachment panel faces a fourth surface of the cooling fan; and
a connector panel, wherein a main portion of the connector panel faces the second surface of the cooling fan, the connector panel includes a concave region to line an edge of the fan blades, the main portion of the connector panel includes fourth and fifth connectors that are in physical and electrical communication with the second and third connectors, respectively, wherein the second connector receives the control signals for the cooling fan from the first connector through the fourth connector when the swappable cooling fan component is in the first orientation, and the third connector receives the control signals for the cooling fan from the first connector through the fifth connector when the swappable cooling fan component is in the second orientation.

14. The information handling system of claim 13, wherein when the cooling fan is in the first orientation, the cooling fan provides an airflow in a first direction.

15. The information handling system of claim 14, wherein when the cooling fan is in the second orientation, the cooling fan provides the airflow in a second direction.

16. The information handling system of claim 15, wherein the airflow moves from the fan blades to the directional airflow component when the swappable cooling fan component is in both the first and second orientations.

* * * * *